United States Patent
White

(10) Patent No.: US 7,171,605 B2
(45) Date of Patent: Jan. 30, 2007

(54) CHECK BIT FREE ERROR CORRECTION FOR SLEEP MODE DATA RETENTION

(75) Inventor: Kraig R. White, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 739 days.

(21) Appl. No.: 10/066,497

(22) Filed: Feb. 1, 2002

(65) Prior Publication Data

US 2003/0149929 A1    Aug. 7, 2003

(51) Int. Cl.
*H03M 13/00* (2006.01)
*G11C 29/00* (2006.01)

(52) U.S. Cl. .................... 714/763; 714/754
(58) Field of Classification Search ........... 714/754, 714/763, 773, 764, 768; 365/200, 201
See application file for complete search history.

(56) References Cited

U.S. PATENT DOCUMENTS

| 4,933,940 | A | 6/1990 | Walter et al. |
| 4,935,900 | A | 6/1990 | Ohsawa |
| 5,465,367 | A | 11/1995 | Reddy et al. |
| 6,199,139 | B1 | 3/2001 | Katayama et al. |
| 6,697,992 | B2 * | 2/2004 | Ito et al. ................ 714/763 |

* cited by examiner

*Primary Examiner*—Joseph D. Torres
(74) *Attorney, Agent, or Firm*—Robert Walsh; Grennblum & Bernstein PLC

(57) ABSTRACT

A DRAM memory has a reduced refresh rate in a sleep mode to conserve power. Error Correction Codes (ECC) are used to correct errors that may arise due to the reduced refresh rate. ECC encoding occurs at the time of entering the sleep mode and ECC decoding for error detection and correction need only take place upon wake up when resuming active mode. In addition, the memory system reassigns a portion of the memory for storing the additional parity bits required for the error correcting code (ECC).

20 Claims, 3 Drawing Sheets

CHECK BIT FREE ERROR CORRECTION FOR SLEEP MODE DATA RETENTION

BACKGROUND OF THE INVENTION

1. Field of the Invention

The present invention generally relates to semiconductor dynamic random access memories (DRAMs) and, more particularly, to correcting bit errors arising during sleep mode due to a reduced DRAM refresh rate.

2. Description of the Related Art

There are two common families of RAM memory devices used as primary storage directly accessible by the microprocessor. The first, static random access memory devices (SRAMs) are based on flip-flop circuits and retain data as long as power is supplied. The second, dynamic random access memory devices (DRAMs), store data as a function of a charge on a capacitor. The capacitors must constantly be refreshed since the charge dissipates. Both have advantages and disadvantages. DRAMs are relatively inexpensive to fabricate but are slow as compared to SRAMs. SRAMs are therefore typically reserved for use as caches. DRAMs, on the other hand, are relatively inexpensive providing a lower cost per bit and are therefore used commonly as main memory.

In their simplest form, a single DRAM memory cell comprises a single transistor and a single capacitor. Depending on the convention used, if a charge is stored on the capacitor the cell is said to store a 1-bit. If no charge is present, the cell is said to store a 0-bit. Since the charge on the capacitor dissipates over time, DRAM systems require additional overhead circuitry to periodically refresh the charge on the capacitor.

Power conservation is an important consideration in many modern devices. This is particularly true for devices which rely on batteries for their source of power. Many different power conservation schemes have been devised to conserve battery power. One of the most effective conservation methods involves placing the device in a suspended or "sleep" mode when no activity has been detected for some predetermined period of time. Probably the most well know example of a device having a sleep mode is a hand held digital assistant device or a lap top computer. In the case of a lap top computer, during a normal or "active mode", the battery provides power for a number of separate systems within the lap top computer. For example, a great deal of power is consumed by the display screen and mechanical disk drive systems. During active mode, all of these systems are powered and readily available for use by the CPU. If however, a predetermined time period has elapsed with no user activity (e.g., 5–10 minutes), then the CPU can execute a routine shutting down various systems to enter the sleep mode. Typically in sleep mode, the display screen is powered down as well as the mechanical disk drives thus conserving considerable power. When the user returns to the laptop computer and enters a command, such as striking any key on the keyboard, the CPU restores power to the sleeping components and the user is able to resume activity right where they left off.

However, even during sleep mode, the DRAM memory still requires periodic refreshment in order to retain the data bits stored therein. In an effort to trim even more power consumption, it has been suggested to decrease the refresh cycle rate of the DRAM memory during sleep mode. Unfortunately, a problem arises in that decreasing the refresh rate can cause some data to be lost. That is, if a charge on a particular DRAM memory cell capacitor is allowed to dissipate below a point at which it can still reliably be read, that bit can be lost. This introduces an error in the particular memory byte to which that bit belongs.

This problem has been addressed in U.S. Pat. No. 6,199,139 to Katayama et al., herein incorporated by reference, and commonly assigned with the present application to International Business Machines Corporation (IBM). Katayama is directed to a memory system wherein the DRAM refresh rate is decreased in a sleep mode. An error correction encoding circuit is provided to encode useful data stored in the DRAM with an error correcting code (ECC).

Error correction codes (ECC) can be used to detect and correct errors. These codes typically rely on using additional bits, sometimes referred to as parity bits, encoded with the data bits to carry the error detection and correction information. For example, in a simple binary parity check, a parity bit is a single bit that represents whether the total number of "1s" in a particular data stream is even or odd. If one of the bits in a particular data stream is "flipped", the parity check bit will detect the error since it will not agree with the odd or even number of 1's in the data stream. More than one parity bit may be used for more complex ECC codes. If enough parity bits are used the error can not only be detected, but also corrected. For example, if four parity bits are used, the first parity bit P1 may be used for the first four bits, the second parity bit P2 used for the second four bits, the third parity bit P3 used for the 1,2,5,6 bits and the fourth parity bit P4 used for the 2,3,6,7 bits. Now, assume that there was an error in the last data bit. In this case, parity bit P1, P3, and P4 would agree. However, parity bit P2 would not agree. Since P2 is the only parity bit not agreeing with the stored word then the error has to be in the 8th bit. This is of course a very simple example. Other codes are known that can correct two or more errors in a data stream.

U.S. Pat. No. 6,199,139 to Katayama, supra, is directed to a DRAM memory system that optimizes a refresh period during a sleep mode. An error correcting code (ECC) encoding circuit is used to encode data stored in the DRAM when entering a sleep mode. An ECC decoding circuit is provided to decode and correct errors each time the refresh operation is required to prevent the loss of data.

However, as is apparent from the above discussion, the use of ECC codes does not come without a price. That is, for each byte of actual data in the DRAM, additional bits are required for the ECC code. These bits require additional storage locations within the DRAM. A way of managing storage space for such additional ECC bits is needed.

SUMMARY OF THE INVENTION

The present invention is therefore directed to a memory system, such as a DRAM, having a reduced refresh rate in a sleep mode to conserve power wherein ECC encoding occurs at the time of entering the sleep mode. ECC decoding for error detection and correction need only take place upon wake up when resuming active mode. In addition, the memory system reassigns a portion of the memory for storing the additional parity bits required for the error correcting code (ECC). In operation, when the memory system enters sleep mode DRAM addresses storing non-critical bits in the DRAM are identified. These addresses are reassigned as a second memory space designated for storing ECC parity bits. The ECC encoding circuit encodes critical data bits with an additional error correcting parity bits which are stored in the second memory space designated for storing ECC parity bits. The ECC is chosen having the capability to correct a predetermined number of bit errors. A variable rate refresh circuit decreases the DRAM refresh rate to a point where the statistical number of errors that would arise due to the reduced refresh rate does not exceed the correction capability of the ECC used. Upon exiting sleep mode an ECC decoding circuit decodes the encoded data and corrects any detected errors to the critical data. Thereafter, the ECC parity bits are discarded and the second memory space is released and becomes available for normal operations.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
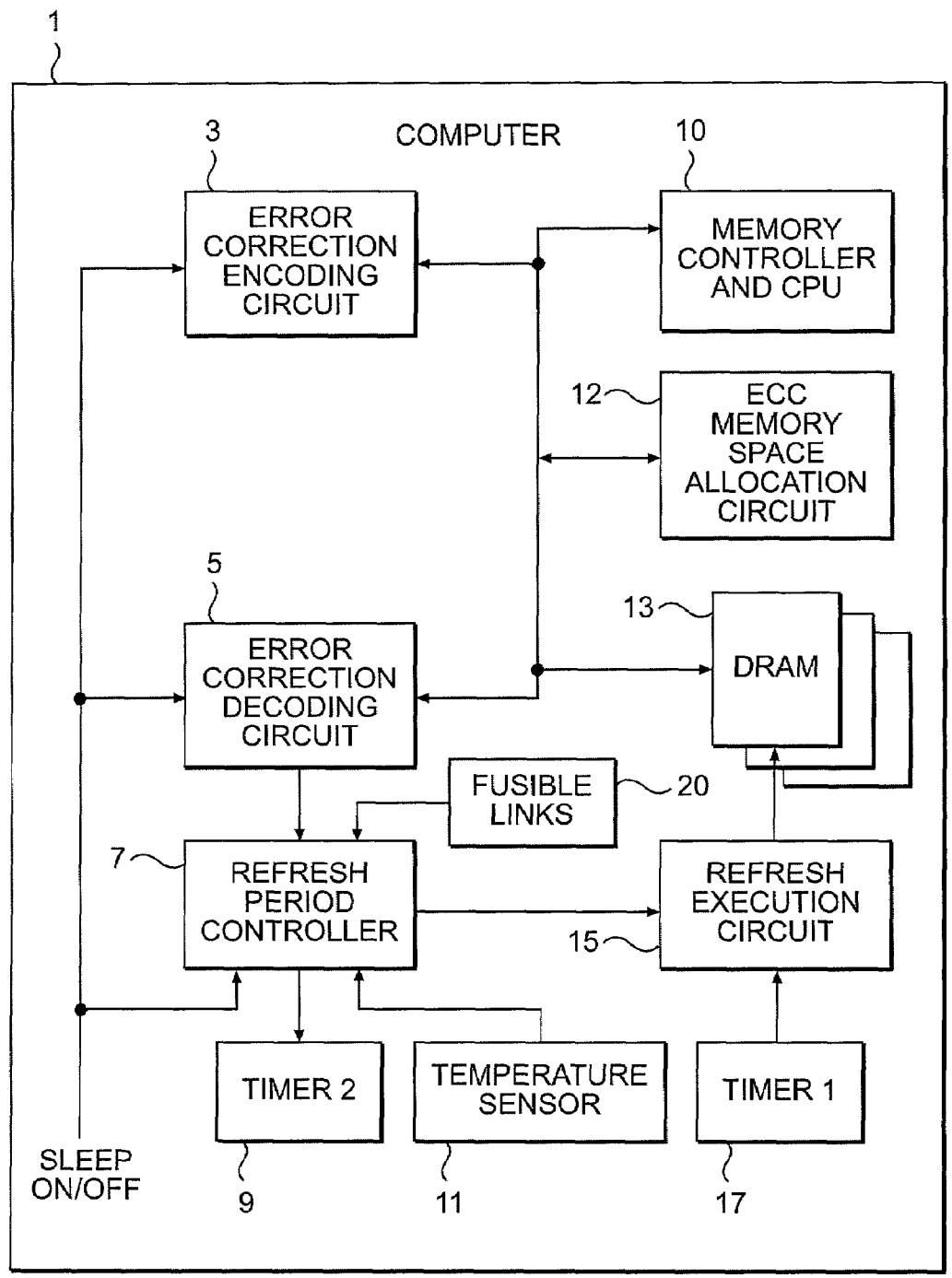
FIG. 1 is a block diagram showing the DRAM system with reduced refresh rate according to the present invention.

Referring now to the drawings, and more particularly to FIG. 1, there is shown a block diagram illustrating a computer 1 including a memory system according to the present invention. A plurality of DRAMs 13 are connected to a memory controller and a CPU 10, an error correction encoding circuit 3, an error correction decoding circuit 5, and a refresh execution circuit 15. The error correction encoding circuit 3 and the error correction decoding circuit 5 receive sleep ON and OFF signals. The refresh period controller 7 is connected to the error correction decoding circuit 5, a timer 2 (9), and a temperature sensor 11. The refresh period controller 7 also receives sleep ON and OFF signals. The refresh execution circuit 15 is connected to the refresh period controller 7 and a first timer 17. In operation, the first timer 17 times the refresh period in active mode. When in a sleep mode, the second timer 9 is used to time the reduced refresh rate. If the temperature sensor 11 is employed several different reduced refresh rates may be stored in a storage device such as fusible links 20 to be selected as a function of temperature which will affect the refresh rate. The second timer 9 may then time the reduced refresh rate according to current device operating temperature. Of course the temperature sensor 11 is optional as well as the second timer 9 as it would be possible to use only one programmable timer rather than the two shown.

When the system switches from the normal mode to the sleep mode, the memory controller 10 or another entity transmits a sleep ON signal to the error correction encoding circuit 3 and to the ECC memory space allocation circuit 12. In it's simplest embodiment, the allocation circuit 12 would always use a preallocated range of addresses for the ECC parity bits' memory space. This range would be specified in the Functional Ops documentation for the DRAM devices 13 and it would be the responsibility of the device micro code to assure that critical data was not stored there (an example of non critical data for a Digital Handset is any previous messages since these can be recreated when the next Base Station connection is made by the Handset). In a more sophisticated implementation the device micro code could make the addresses of the ECC parity bits memory space dynamic based on the current status of the application being executed.

The error correction encoding circuit 3 performs encoding using, for example, Reed-Solomon (hereafter referred to as RS) code. Upon the receipt of the sleep ON signal, the error correction encoding circuit 3 encodes the contents of the DRAMs 13, and writes the generated codes to the DRAMs 13 in the space allocated by the ECC memory space allocation circuit. The code type is not limited to RS code, but may be BCH code (Bose-Chaudhuri-Hocquenghem code) or any other suitable ECC code. These codes can provide an efficient capability for the correction of errors more than dual errors. Following this, the refresh execution circuit 15 is set such that the refresh period controller 7 reduces the refresh frequency of the DRAMs 13. The degree of reduction of the refresh frequency may be determined by using the output of the temperature sensor 11, which is connected to the refresh period controller 7, or may be determined in advance as a refresh period that is to be employed immediately after the system enters the sleep mode. When re-entering active or normal mode, the error correction decoding circuit 5 initiates the detection and correction of errors, and the corrected data is again written to the DRAMs 13.

The simplest embodiment would have the maximum sleep mode refresh period determined during the DRAM device 13 manufacturing test and stored in a storage device on the DRAM device such as fusible links 20. When the using device (e.g. A Hand Set) was turned on it could read this value from each DRAM device and use the minimum value as a refresh period during sleep mode. A more sophisticated approach could have several temperature cases tested at DRAM device level and stored in fusible links on the DRAM device. The sleep mode refresh period could then be a function of the current device operating temperature.

Figure 2A:
FIG. 2A is a diagram showing memory allocation in the DRAM during normal operation.

In the example shown in FIG. 2A the DRAM is arranged with a plurality of addressable word lines (Word 0–Word X) each comprising eight, eight bit bytes (Byte 0–Byte 7). Of course each byte comprises a plurality of individual DRAM cells each of which store one bit. In normal operation the entire DRAM memory array are available for storing application data, where application data is any valid or critical data that the CPU still requires access to support a current application.

Figure 2B:
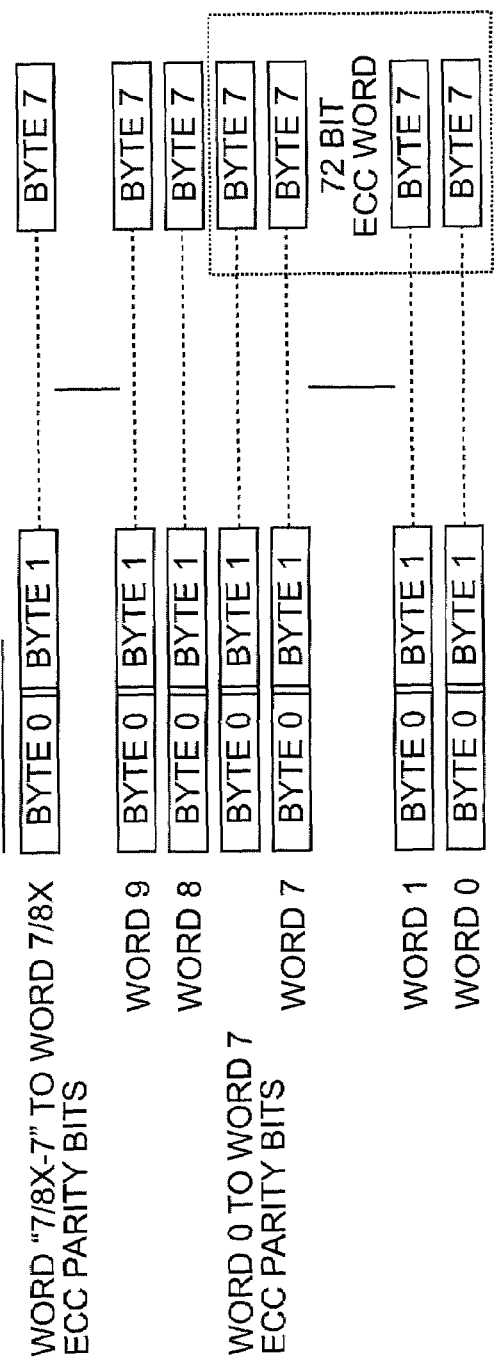
FIG. 2B is a diagram showing memory allocation in the DRAM during sleep mode.

Referring to FIG. 2B, when entering the sleep mode, the system micro code will cause the critical data in memory (i.e. all data with the exception of data stored in the ECC parity bits' memory space that was identified by the allocation circuit 12) to be read and will calculate ECC parity bits' to be stored in the memory space that was created by the allocation circuit.

FIG. 2B illustrates the content of system memory after the ECC parity bits have been generated and stored for the Application data shown in FIG. 2A. For this example, a serial ECC embodiment was assumed. Every ninth logical word (e.g. the word labeled "Word 0–Word 7 ECC bits") would be used to store ECC parity bits for the previous eight words. ECC words would be configured serially across Application Words on a byte basis (e.g. Word 0 Byte 7; Word 1 Byte 7; Word 2 Byte 7; Word 3 Byte 7; Word 4 Byte 7; Word 5 Byte 7; Word 6 Byte 7; Word 7 Byte 7; and Word 0–Word 7 ECC bits would form a 72 bit ECC word comprised of 64 bits of application data and 8 bits of ECC parity data. In this embodiment, "X–X/8" Words of application data may be retained during sleep mode (i.e. X/8 Words were required for the total ECC parity bits).

Figure 3:
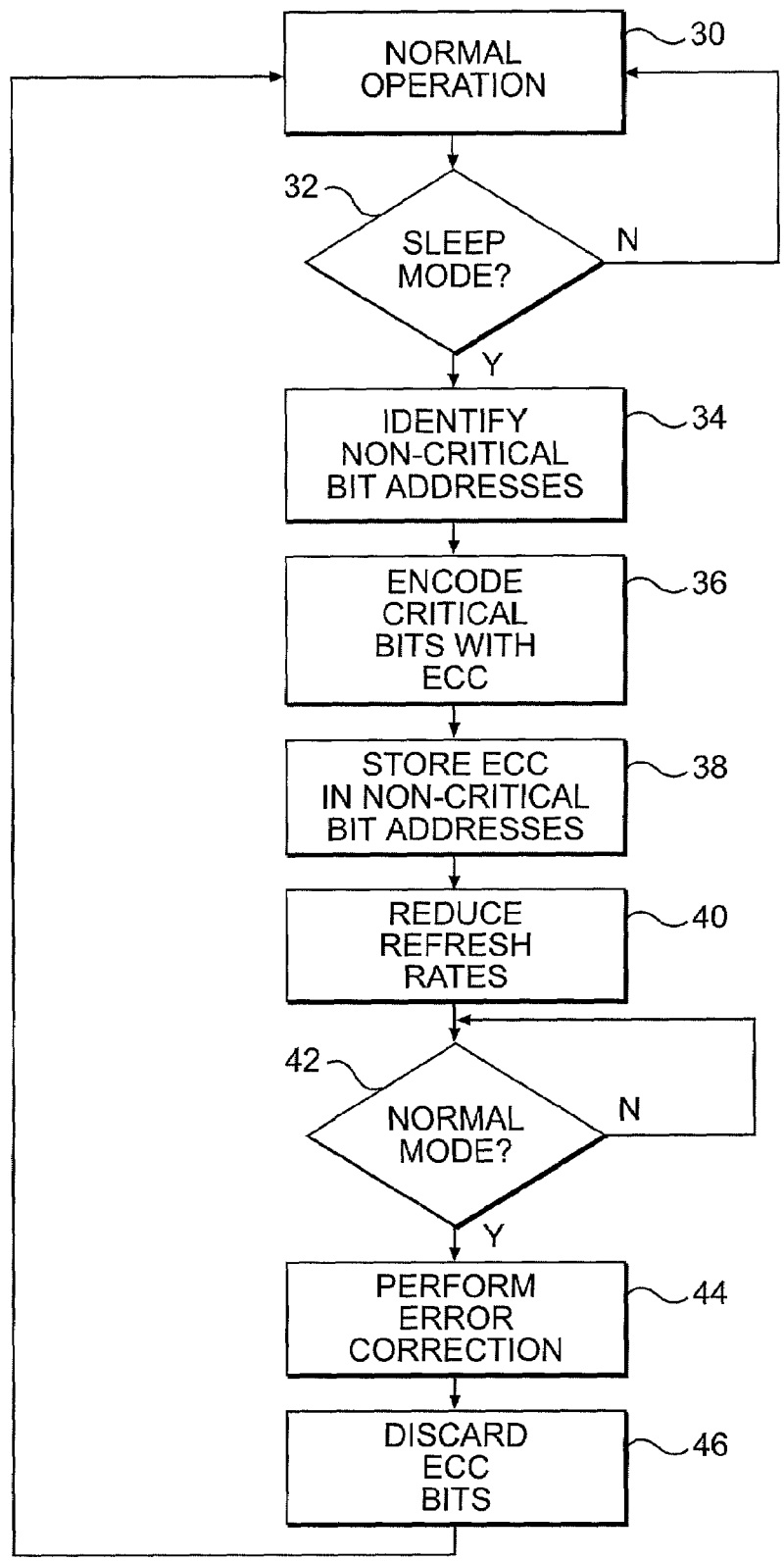
FIG. 3 is a flow diagram showing DRAM during normal operation.

Referring to FIG. 3, there is shown a flow diagram illustrating the operation of the present invention. Of course the steps taken may be stored in a computer readable medium for causing a processor to execute the steps. In normal operation, block 30. All memory addresses are available for the CPU to utilize. Of course at any given time many of the memory addresses store non-critical data. That is, data which is no longer required for a current application but which has not yet been rewritten by critical data. Periodically, in decision block 32, it is determined if sleep mode should be entered to conserve power. Usually, sleep mode is entered if no user activity has been detected for several minutes. If the system is still active normal operation continues. However, if sleep mode is entered the ECC memory space allocation circuit 12 (FIG. 1) identifies non-critical address bits in block 34. Of course other more conventional sleep mode routines are also initiated such as powering down the display screen and disk drives in the case of a computer.

Thereafter, the critical bits are encoded with ECC bits in block 36 and the ECC bits are stored in the non-critical address locations in block 38.

With the critical bits encoded with ECC bits the refresh rate can be reduced, block 40, thus further conserving energy.

The refresh rate can be reduced by a factor of 2X per each decade Celsius reduction in DRAM device junction temperature. The DRAM cells that don't follow this relationship will be single cells that can be corrected by the ECC. ECC parity bits to be stored in the ECC parity bits memory space that was created by the allocation circuit.

In decision block 42 it is determined whether or not normal or active mode should be resumed. In the case of a computer, entry into active mode may be signified for example by detecting the user striking a key or moving a mouse or other input device connected to the computer. During the sleep mode errors may have been introduced into the DRAM memory due to the reduce refresh rate. Upon resuming normal mode the error correction decoding circuit 5 (FIG. 1) uses, in block 44, the stored ECC bits to correct any error to the critical bits that may have occurred during the sleep mode. Thereafter, the ECC bits are discarded at block 66 and normal refresh cycles are resumed.

While the invention has been described in terms of a single preferred embodiment, those skilled in the art will recognize that the invention can be practiced with modification within the spirit and scope of the appended claims.

We claim:

1. A memory system having a reduced refresh rate in a sleep mode, comprising:
    a dynamic memory;
    an error correction code (ECC) memory allocation circuit for identifying non-critical bit addresses in said dynamic memory and allocating said addresses as ECC addresses when entering from an active mode to sleep mode;
    an ECC encoder for encoding critical bits with error correction codes, said error correction codes being stored in said ECC addresses;
    a refresh execution circuit for reducing a refresh rate in said sleep mode and increasing said refresh rate in said active mode; and
    an ECC decoder for decoding said critical bits encoded with said error correction codes when reentering said active mode.

2. A memory system as recited in claim 1 further comprising a storage device for storing sleep mode refresh rate data.

3. A memory storage device as recited in claim 2 wherein said storage device comprises a fusible link.

4. A memory system as recited in claim 1 further comprising:
    a storage device for storing a plurality of sleep mode refresh rate data; and
    a temperature sensor, wherein said refresh execution circuit selects one of said sleep mode refresh rate data according to operating temperature.

5. A memory system as recited in claim 4 wherein said storage device comprises a fusible link.

6. A memory system as recited in claim 4 wherein said refresh rate is reduced by a 2 X factor for each decade Celsius reduction in operating temperature.

7. A memory system as recited in claim 1 wherein said error correction codes comprise one of Reed-Solomon code and Bose-Chaudhuri-Hocquenghem code.

8. A memory system as recited in claim 1 wherein said ECC memory allocation circuit reassigns said non-critical bit addresses as a second memory space designated for storing ECC parity bits.

9. A memory system as recited in claim 1 wherein said ECC memory allocation assigns ECC addresses dynamically to the last byte of each word address.

10. A method for reducing the refresh rate of a memory in sleep mode, comprising the steps of:
    switching from an active mode to a sleep mode;
    identifying non-critical bit addresses;
    encoding critical bits with an error correction code (ECC);
    storing ECC codes at said non-critical bit addresses;
    reducing a refresh rate for said memory;
    performing error correction on said critical bits using said ECC codes when reentering active mode; and
    discarding said ECC bits.

11. A method for reducing the refresh rate of a memory in sleep mode as recited in claim 10 further comprising the steps of:
    determining an operating temperature for said memory; and
    selecting one of a plurality of refresh rates based on said operating temperature of said memory.

12. A method for reducing the refresh rate of a memory in sleep mode as recited in claim 11 further comprising the step of:
    reducing said operating temperature by a 2 X factor for each decade Celsius reduction in operating temperature.

13. A method for reducing the refresh rate of a memory in sleep mode as recited in claim 10 further comprising the step of:
    preallocating addresses in memory to store non-critical bits.

14. A method for reducing the refresh rate of a memory in sleep mode as recited in claim 10 further comprising the step of:
    storing said ECC codes for a word of a last byte address for said word.

15. A computer readable medium embodying instructions for causing a computer to take steps to reduce the refresh rate of a memory in sleep mode, the steps comprising:
    switching from an active mode to a sleep mode;
    identifying non-critical bit addresses;
    encoding critical bits with an error correction code (ECC);
    storing ECC codes in said non-critical bit addresses;
    reducing a refresh rate for said memory;
    performing error correction on said critical bits using said ECC codes when reentering active mode; and
    discarding said ECC bits.

16. A computer readable medium embodying instructions for causing a computer to take steps to reduce the refresh rate of a memory in sleep mode as recited in claim 15, the steps further comprising:
    reducing said operating temperature by a 2 X factor for each decade Celsius reduction in operating temperature.

17. A computer readable medium embodying instructions for causing a computer to take steps to reduce the refresh rate of a memory in sleep mode as recited in claim 15, the steps further comprising:
  preallocating addresses in memory to store non-critical bits.

18. A computer readable medium embodying instructions for causing a computer to take steps to reduce the refresh rate of a memory in sleep mode as recited in claim 15, the steps further comprising:
  storing said ECC codes for a word of a last byte address for said word.

19. A computer readable medium embodying instructions for causing a computer to take steps to reduce the refresh rate of a memory in sleep mode as recited in claim 15 wherein said error correction codes comprise Reed-Solomon code.

20. A computer readable medium embodying instructions for causing a computer to take steps to reduce the refresh rate of a memory in sleep mode as recited in claim 15, wherein said error correction codes comprise Bose-Chaudhuri-Hocquenghem code.

* * * * *